(12) United States Patent
Spitzer et al.

(10) Patent No.: US 7,765,502 B1
(45) Date of Patent: Jul. 27, 2010

(54) ASIC FUNCTIONAL SPECIFICATION PARSER

(75) Inventors: Marc Spitzer, San Jose, CA (US); John Packer, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 1289 days.

(21) Appl. No.: 11/241,661

(22) Filed: Sep. 29, 2005

Related U.S. Application Data

(63) Continuation-in-part of application No. 11/075,830, filed on Mar. 8, 2005, now abandoned.

(60) Provisional application No. 60/551,531, filed on Mar. 8, 2004.

(51) Int. Cl.
    *G06F 17/50* (2006.01)

(52) U.S. Cl. .................. 716/5; 716/4; 716/17

(58) Field of Classification Search .......... 716/4, 716/5, 17
    See application file for complete search history.

(56) References Cited

U.S. PATENT DOCUMENTS 5,956,741 A * 9/1999 Jones .............. 711/1

* cited by examiner

*Primary Examiner*—Thuan Do
(74) *Attorney, Agent, or Firm*—Martine Penilla & Gencarella, LLP

(57) ABSTRACT

A method for generating hardware description language source files is provided. The method includes extracting an input/output (I/O) list and building a port list declaration file from the I/O list. The method also includes building a default instantiation file according to renaming rules and interpreting coding constructs to determine both variable types and sizes. The method further includes generating a sensitivity list.

20 Claims, 4 Drawing Sheets

ASIC FUNCTIONAL SPECIFICATION PARSER

CROSS REFERENCE TO RELATED APPLICATIONS

The present application is a continuation-in-part and claims priority under 35 U.S.C. § 120 of co-pending application that is commonly assigned to the assignee of the present invention, which is entitled "Automatic Generators for Verilog Programming", Application Number, 11/075,830 filed Mar. 8, 2005 now abandoned, which claims priority under 35 U.S.C. § 119(e) from U.S. Provisional Patent Application No. 60/551,531, filed Mar. 8, 2004. The disclosures of each Application, and the Provisional Application, are incorporated by reference in their entirety for all purposes.

BACKGROUND

Writing ASIC source files in Verilog Hardware Description Language, (Verilog HDL), requires certain redundant overhead. The redundant overhead occurs when the register transfer logic (RTL) file is being built during which the same signals have to be listed at different places within the list. For example, a port list might list signals a, b, and c as they are coming in and then in the input/output list, the same signals a, b, and c might be listed as pins coming out. Some of the redundant information includes declaring the type and sizes of signals used in the design, sensitivity lists for constructs such as state machines and case statements, port lists which are the same as the input/output declarations, and module file instantiations. Moreover, such redundant information is entered manually, and such maintenance consumes large portions of an individual's time.

As a result, there is a need to eliminate the creation of such redundant information manually in order to reduce the overhead involved with respect to an individual's time.

SUMMARY

Broadly speaking, the present invention fills these needs by providing a method and apparatus for removing redundant overhead for programming in the Verilog HDL language. It should be appreciated that the present invention can be implemented in numerous ways, including as a process, an apparatus, a system, or a device. Several inventive embodiments of the present invention are described below.

In one embodiment, a method for generating a register interface module is provided. The method initiates with providing a functional specification. The method includes identifying successive register descriptions within the functional specification and extracting register information from each of the successive register descriptions. The method further includes verifying a name assigned to each of the successive register descriptions is unique among the register descriptions and generating a register definition file once each name has been verified as being unique. In one embodiment, the method operations are included as program instructions on a computer readable medium.

In another embodiment, a computing system configured to generate a register interface module during a design of an integrated circuit is provided. The system includes a central processing unit (CPU) and a memory in communication with the CPU. The memory contains register interface program instructions configured to be executed by the CPU and a functional specification of the integrated circuit. Execution of the program instructions cause the processor to perform a method that includes identifying successive register descriptions within the functional specification; extracting register information from each of the successive register descriptions; verifying a name assigned to each of the successive register descriptions is unique among the register descriptions; and generating a register definition file once each name has been verified as being unique.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for an apparatus and method for extracting register information and generating a register interface module. The embodiments described below are described with reference to Verilog coding syntax. However, one skilled in the art will appreciate that these embodiments may be expanded to apply to any hardware description language (HDL). It will be obvious, however, to one skilled in the art, that the present invention may be practiced without some or all of these specific details. In other instances, well known process operations have not been described in detail in order not to unnecessarily obscure the present invention.

When an ASIC functional specification is published and assigned for individuals to implement, generating the register interface module, in VERILOG HDL, to interface to the registers described in the specification can take some time. Since the description of the registers follows the same convention from one register description to another, a script has been designed to parse the specification and extract the register information needed to generate the register interface module. Once the script has generated such a module, it may also generate a parameter file, again, VERILOG HDL based, which holds register address locations and register bit locations for each register. This parameter file may be used by the generated register interface module to correctly place and accept register information when these registers are being accessed.

Figure 1:
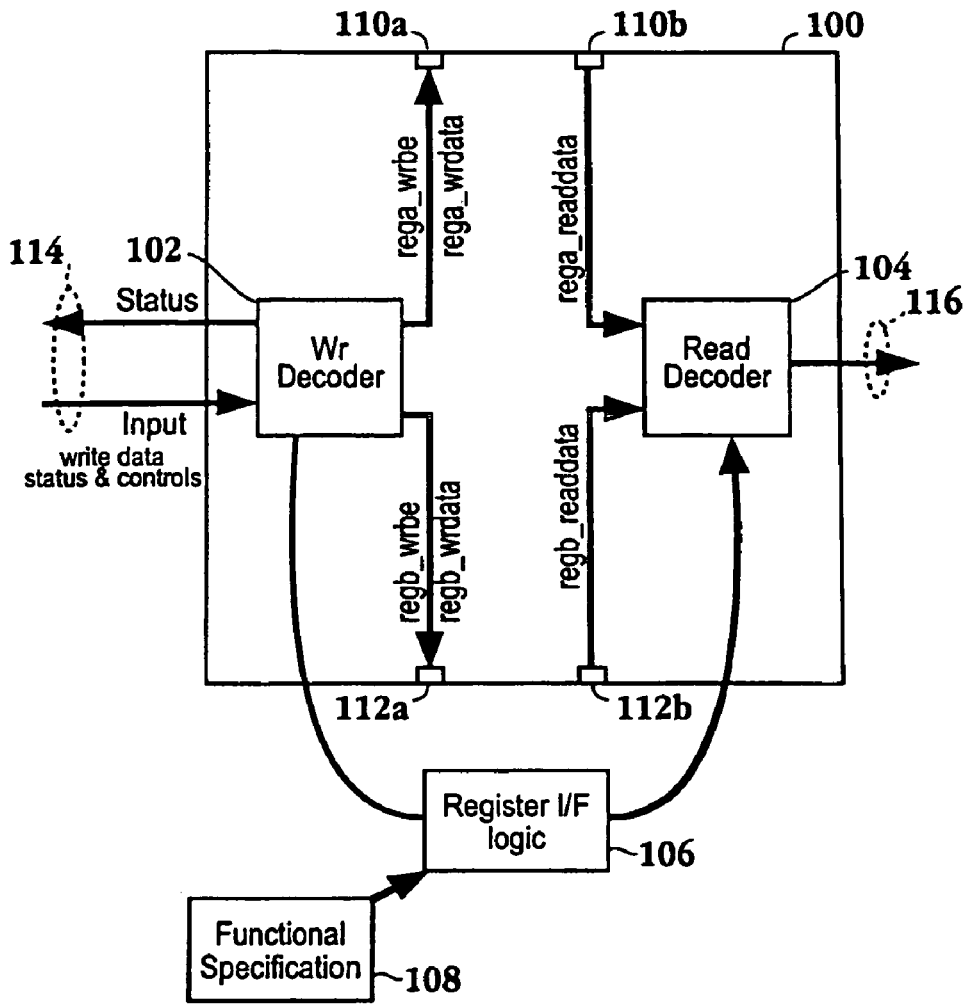
FIG. 1 is a high-level simplified schematic diagram of a register interface module generated through the register interface logic in accordance with one embodiment of the invention.

FIG. 1 is a high-level simplified schematic diagram of a register interface module generated through the register interface logic in accordance with one embodiment of the invention. Registers are used in what may be referred to as a register interface by default. These registers need to be accessed and through the embodiments described herein a script standardizing how to access the registers through a standard file format provides an automated manner of taking functional specifications, and extracting out register information in some of the bit information, in order to write this to a register interface module. Register interface module 100 includes read decoder 104 and write decoder 102. Functional specification 108, which may be a text based file, is parsed by register interface logic 106. It should be appreciated that register interface logic 106 may be a script that reads the functional spec 108 and contains information that defines the addresses of the register. Inputs and outputs for each write decoder 102 and read decoder 104 must be defined. Accordingly, ports 110a and 110b which function as input and output from register A are provided. Similarly, ports 112a and 112b, which function to accept inputs and outputs from register B are also provided. Signals 114, status and input write data, represent the register interface write direction, while signal 116, the read data, represents the register interface read direction. Through the embodiments described herein, the script of register interface logic 106 will generate register declaration files and the register interface module. It should be appreciated that decoders 102 and 104 are generally very large and can take weeks for a designer to build manually. The embodiments described herein, through register interface logic 106, may take a matter of minutes to build the corresponding read and write decoders.

Figure 2:
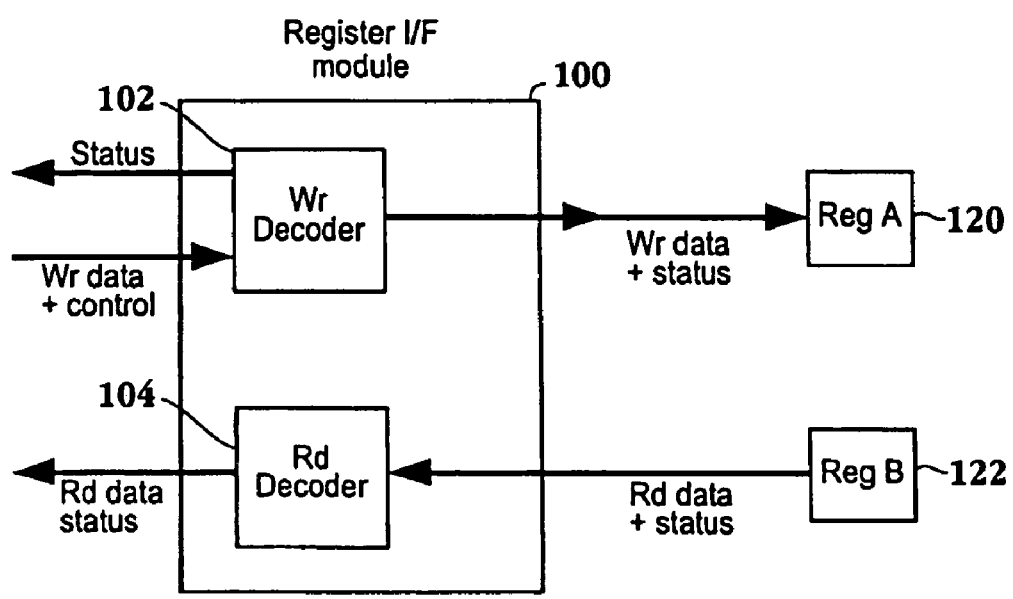
FIG. 2 is a high-level schematic diagram illustrating an alternative embodiment of the register interface module where inside of the register interface module is a write and read decoder and externally are registers, in accordance with one embodiment of the invention.

FIG. 2 is a high-level schematic diagram illustrating an alternative embodiment of the register interface module where inside of the register interface module is a write and read decoder and externally are registers, in accordance with one embodiment of the invention. It should be appreciated that register A 120 and register B 122 may be located inside register interface module 100 of FIG. 1. Alternatively, register A 120 and register B 122 may be located external to register interface module 100 as depicted in FIG. 2. In FIG. 2, register interface module 100 is generated by the script of register interface logic 106 which utilizes the functional specification 108 as discussed above with reference to FIG. 1. In one embodiment, the script builds register interface module 100 with the inputs, and then builds write strobes, write data, and read control data. Thus, the script generates control and status signals, and in one embodiment control signals are based on the status signals.

Figure 3:
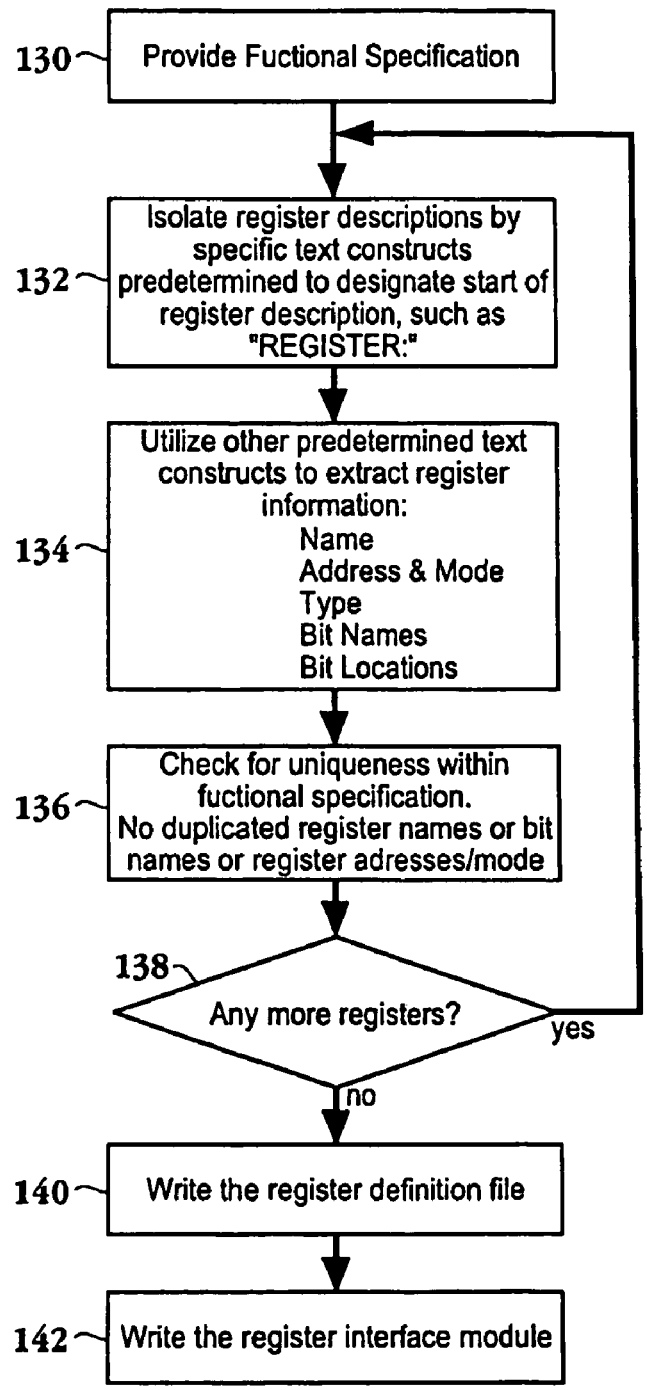
FIG. 3 is a flow chart diagram illustrating the method operations for generating a register interface module in accordance with one embodiment of the invention.

FIG. 3 is a flow chart diagram illustrating the method operations for generating a register interface module in accordance with one embodiment of the invention. The method initiates with operation 130 where the functional specification is provided. It should be appreciated that the functional specification may be a text-based specification in accordance with one embodiment of the invention. The method then advances to operation 132 where register descriptions are isolated. In one embodiment, specific text constructs that are pre-determined to designate the start of a register description are used to isolate the register descriptions. For example, the term "REGISTER:" may be used to designate the beginning of a register. Thus, the script will look for certain text designated as identifying the beginning of a register description. The method then proceeds to operation 134 where additional information is extracted from the register information utilizing other pre-determined text constructs. For example, a name, an address and mode, a type, bit names, and bit locations are exemplary information, which may be extracted from the register information of the functional specification according to other pre-determined text constructs. The method then moves to operation 136 where each name is checked for uniqueness within the functional specification. It should be appreciated that no duplicated register names will be allowed, as this will cause problems in the design of the corresponding integrated circuit. In one embodiment, where there are duplicate register names an error will be issued in response to this duplication. In another embodiment, duplication of bit names and/or register address and mode information may also be checked. Any duplication of the bit names or the register address and mode will also result in an error signal being issued. The method then advances to decision operation 138 where it is determined if there are more registers within the functional specification. If there are more registers within the functional specification the method returns to operation 132 and repeats as described above. It should be appreciated that there are numerous registers used in the design of an integrated circuit and the flow chart illustrated in FIG. 3 will successively process each register. Once all of the registers within the functional specification have been processed the method moves from decision operation 138 to operation 140. In operation 140, the register definition file is written. From the register definition file the register interface module is generated in operation 142. The register interface file may be embodied as a text file, which describes the register interface modules depicted in FIGS. 1 and 2.

Figure 4:
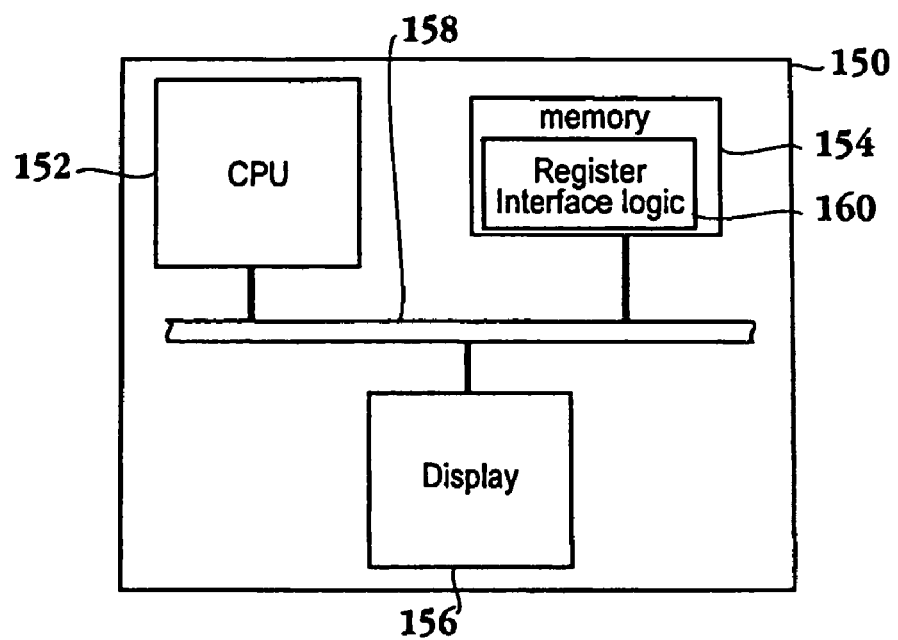
FIG. 4 is a simplified schematic diagram of a system configured to generate a register interface module during a design of an integrated circuit in accordance with one embodiment of the invention.

FIG. 4 is a simplified schematic diagram of a system configured to generate a register interface module during a design of an integrated circuit in accordance with one embodiment of the invention. Computing system 150 includes central processing unit (CPU) 152, memory 154, and display 156. CPU 152, memory 154, and display 156 may communicate with each other over buff 158. Memory 154 includes register interface logic 160. It should be appreciated that register interface logic 160 may be computer codes stored within memory 154 which enables the functionality described with respect to FIGS. 1 through 3. For example, the register interface logic may be program instructions configured to be executed by CPU 152 and execution of these program instructions will cause the processor to perform the method operations described with reference to FIG. 3. One skilled in the art will appreciate that the functional specification may be stored within memory 154, or alternatively on an external memory in communication with computing system 150. Register interface logic 160 will access the functional specification whether it is stored in memory 154 or an external device in order to parse through the text to generate the register interface module.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer implemented method for generating a register interface module, comprising method operations of:
   accessing a functional specification stored in memory of a computing system;
   identifying successive register descriptions within the functional specification;
   extracting register information from each of the successive register descriptions;
   verifying a name assigned to each of the successive register descriptions is unique among the register descriptions;
   generating a register definition file once each name has been verified as being unique and
   writing the register definition file to the memory.

2. The method of claim 1, wherein the register interface module is generated from the register definition file.

3. The method of claim 1, wherein the method operation of identifying successive register descriptions within the functional specification includes,
   parsing text to identify a start to a register description.

4. The method of claim 1, wherein the method operation of extracting register information from each of the successive register descriptions includes, parsing text constructs to identify a name of each register.

5. The method of claim 4, further comprising:
   identifying from the text constructs, register information selected from the group consisting of an address/mode, a type, a bit name, and a bit location.

6. The method of claim 5, wherein duplication of one of the address/mode and the bit name among the register descriptions triggers an error signal.

7. The method of claim 1 further comprising:
   issuing an error signal if duplicate names are identified among the register descriptions.

8. A computer storage and readable medium having program instructions for generating a register interface module, comprising method operations of:
   executing and providing a functional specification for the program instructions;
   program instructions for identifying successive register descriptions within the functional specification;
   program instructions for extracting register information from each of the successive register descriptions;
   program instructions for verifying a name assigned to each of the successive register descriptions is unique among the register descriptions; and
   program instructions for generating a register definition file once each name has been verified as being unique.

9. The computer readable medium of claim 8, wherein the register interface module is generated from the register definition file.

10. The computer readable medium of claim 8, wherein the program instructions for identifying successive register descriptions within the functional specification includes,
    program instructions for parsing text to identify a start to a register description.

11. The computer readable medium of claim 8, wherein the program instructions for extracting register information from each of the successive register descriptions includes,
    program instructions for parsing text constructs to identify a name of each register.

12. The computer readable medium of claim 11, further comprising:
    program instructions for identifying from the text constructs, register information selected from the group consisting of an address/mode, a type, a bit name, and a bit location.

13. The computer readable medium of claim 8 further comprising:
    program instructions for issuing an error signal if duplicate names are identified among the register descriptions.

14. The computer readable medium of claim 12, wherein duplication of one of the address/mode and the bit name among the register descriptions triggers program instructions for generating an error signal.

15. A computing system configured to generate a register interface module during a design of an integrated circuit, comprising:
    a central processing unit (CPU);
    a memory in communication with the CPU, the memory containing register interface program instructions configured to be executed by the CPU and a functional specification of the integrated circuit, wherein execution of the program instructions cause the processor to perform a method comprising:
    identifying successive register descriptions within the functional specification;
    extracting register information from each of the successive register descriptions;
    verifying a name assigned to each of the successive register descriptions is unique among the register descriptions; and
    generating a register definition file once each name has been verified as being unique.

16. The computing system of claim 15, wherein the functional specification is stored in a text-based format.

17. The computing system of claim 15, further comprising:
    a bus enabling communication between the memory and the CPU.

18. The computing system of claim 15, wherein text term "REGISTER:" identifies a beginning of each of the register descriptions.

19. The computing system of claim 15, wherein extracting register information from each of the successive register descriptions includes, parsing text constructs to identify a name of each register.

20. The computing system of claim 19, further comprising:
    identifying from the text constructs, register information selected from the group consisting of an address/mode, a type, a bit name, and a bit location.

* * * * *